May 28, 1968 H. F. KOEHLER 3,385,702

PHOTOMECHANICAL METHOD OF MAKING METALLIC PATTERNS

Filed Oct. 3, 1962 4 Sheets-Sheet 1

INVENTOR
HERMAN F. KOEHLER

BY Joseph C. Redmond, Jr.

ATTORNEY

COPPER CLAD INSULATING MATERIAL

EXPOSE & ETCH PATTERN

PRINTED CIRCUIT CARD 1 LAYER

May 28, 1968 H. F. KOEHLER 3,385,702

PHOTOMECHANICAL METHOD OF MAKING METALLIC PATTERNS

Filed Oct. 3, 1962 4 Sheets-Sheet 4

United States Patent Office 3,385,702

Patented May 28, 1968

3,385,702

PHOTOMECHANICAL METHOD OF MAKING METALLIC PATTERNS

Herman F. Koehler, Wappingers Falls, N.Y., assignor to International Business Machines Corporation, New York, N.Y., a corporation of New York Filed Oct. 3, 1962, Ser. No. 228,079
5 Claims. (Cl. 96—36.2)

This invention relates to wiring panels and, more particularly, to methods for fabricating printed circuit wiring panels.

As microminiaturization reduces the physical size of electronic components, wiring panels must be provided that have a maximum number of circuit point interconnection possibilities within a relatively small area. One alternative for realizing this objective is to minimize the physical size of connecting points, circuit line width and line spacing. Manifestly, the generation of unique electric circuits on this basis is complicated. The advantages of microminiaturized components, as a result, may be offset, in part at least, by wiring panels of prohibitive costs. It is desirable, therefore, to develop a wiring panel that provides a maximum degree of interconnection possibilities and yet, is versatile and inexpensive for fabricating any desired circuit pattern.

A general object of the present invention is an advanced wiring panel that simplifies the fabrication of unique electric circuits.

One object is a circuit pattern that has the maximum allowable interconnection possibilities among a plurality of points consistent with minimum line spacing and line width.

Another object is a photo deletion process for generating electric circuits.

Another object is a method of fabricating matrix wiring panels to have unique microminiaturized electric circuits incorporated therein.

Another object is a method of fabricating unique printed circuits without any requirement for generating individual artwork.

Another object is a method of fabricating nonplanar electric circuits.

Still another object is a method of generating unique electric circuits by computer means in cooperation with matrix wiring patterns.

These and other objects are accomplished in accordance with the present invention, one illustrative embodiment of which comprises the steps of preparing a tracing of a modular circuit pattern that provides all allowable interconnection paths among a plurality of circuit points, tracing the pattern on a suitable plate for photographic reduction to improve detail, preparing a positive of the reduced pattern as a subject for a step and repeat camera which provides horizontal and vertical sequential reproduction of the pattern on a negative plate, the pattern appearing as a wiring matrix, using the step and repeat negative of the wiring matrix as one plate in a two plate photographic printed circuit process, employing a printed circuit generator to produce a dot pattern on a positive plate as the second plate in the photographic printed circuit process, registering the first and second photographic plates whereby a dot is positioned in each path of the circuit pattern except in those paths desired to be uninterrupted, coating a copper-clad insulating member with a light sensitive material, applying a light source to the copper-clad member through the first and second prints to expose those sections of copper-clad member where a line appears, washing away all unexposed light sensitive material on the copper-clad member, etching away the copper material not exposed to the light source, repeating the previously listed steps to fabricate additional wiring matrices on insulating members, laminating together a plurality of these members and interconnecting the circuit points through suitable throughplated holes.

One feature of the present invention is a circuit pattern that provides all allowable paths to interconnect a plurality of points within a modular area, and a dot pattern that when registered with the circuit pattern provides one and only one dot overlying each path section of the circuit pattern.

Another feature is a modular circuit pattern arranged in a wiring matrix so that any two random points in the matrix may be interconnected.

Another feature is a wiring panel that provides within certain electrical and other parameter requirements the maximum number of circuit points, circuit paths and interconnection possibilities among the circuit points.

Another feature is a process for generating unique electric circuits by means of an original matrix pattern and a computer generated dot pattern.

Another feature is a plurality of matrix patterns having individually defined circuit configurations, the plurality of patterns being laminated together and suitably interconnected to form a nonplanar circuit having a substantially unlimited degree of topological freedom in interconnecting any random points in the laminated area.

Another feature is a photographic deletion process for generating unique topological configurations whereby a dot pattern and a matrix pattern that interconnects a plurality of points are registered, the patterns serving as a filter to a light source directed on a photo sensitive metallic-clad member which when subjected to an etching process provides a unique topological configuration in accordance with the patterns.

Still another feature is a dot pattern and a circuit pattern which when brought into registration with one another and certain dots are omitted, generates unique circuit patterns which may be reproduced by a photographic printed circuit process.

Still another features is a circuit pattern that interconnects a plurality of circuit points in a unique configuration so that a minimum dot pattern may be generated to be congruent with break-sections in each path in the circuit pattern when both patterns are placed in registration with one another.

The foregoing and other objects, features and advantages of the invention will be apparent from the following more particular description of preferred embodiments of the invention as illustrated in the accompanying drawings.

Figure 1:
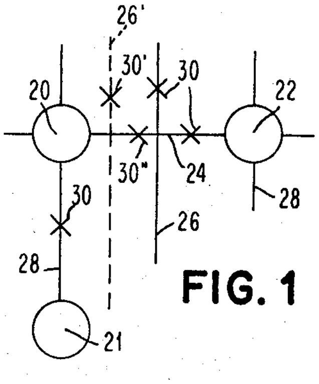
FIGURE 1 is a topological pattern for interconnecting three points.

Referring to FIGURE 1, a topological pattern is indicated that provides paths for connecting points 20, 21 and 22 and a vertical path between points 20 and 22. The pattern comprises essentially horizontal line 24 and vertical line 28. An additional vertical path 26 is included in the pattern to allow connections between non-adjacent points in the same column without passing through other points. Individual connections between any two points may be made by breaking all possible paths except the desired path. To facilitate the breaking of all paths in the topological configuration, a break pattern is supplied that insures that any point may be isolated from the other points by breaking the paths of one or more of the break points or sections which are aligned vertically and horizontally. The break pattern for the configuration, shown in FIGURE 1, is indicated by cross marks 30. It will be noted that four break marks 30 are required to isolate the points 20, 21 and 22 from the remaining points in the configuration. It is assumed, of course, that the break point pattern appears at the adjacent point so that although the line 28 associated with the point 22 is unbroken, a break point, not shown, associated with adjacent circuit points includes a break point that disconnects the point 22 from the other points in the pattern.

It is believed apparent that the horizontal and vertical paths 24 and 26 need not be limited to the orientation, shown in FIGURE 1, but may, of course, be rotated in any one of an infinite number of directions without altering the configuration for interconnecting any two points in a configuration. The orientation selected, however, should facilitate the break pattern since the combination of the topological pattern and the break pattern will be employed to generate unique configurations.

The number of connections that may be made between circuit points in the same column may be increased by adding additional vertical lines 26' between the circuit points. The number of vertical lines is only limited by the spacing between the circuit points and the width of the conductor required. Each vertical path 26' added to a pattern requires two additional break points 30' and 30'' to isolate each point in the column from the other circuit points or paths in the configuration. It will be noted that the additional path 26' expands the break pattern in an orderly manner. This feature is particularly useful as will appear hereinafter in translating a broken topological pattern into a unique circuit configuration.

Figure 2:
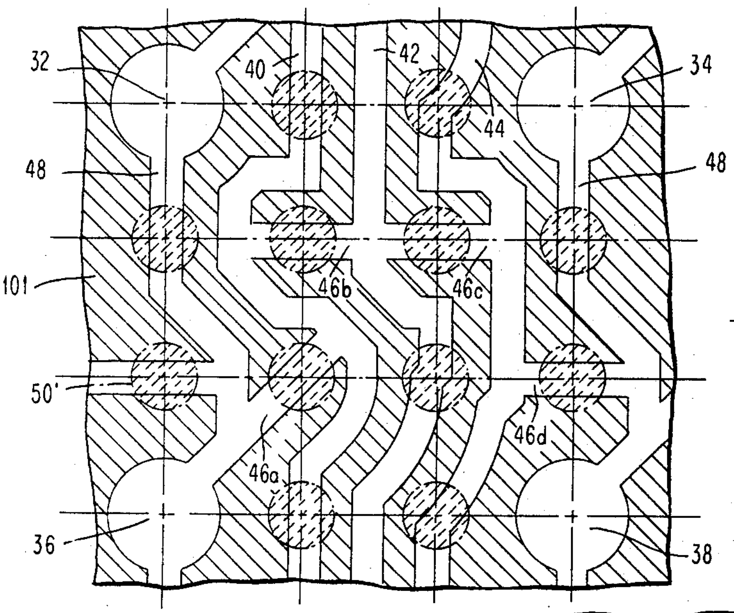
FIGURE 2 is a plan view of a topological pattern that interconnects a plurality of points in an orthogonal manner with three vertical paths between points.
Figures 3, 4:
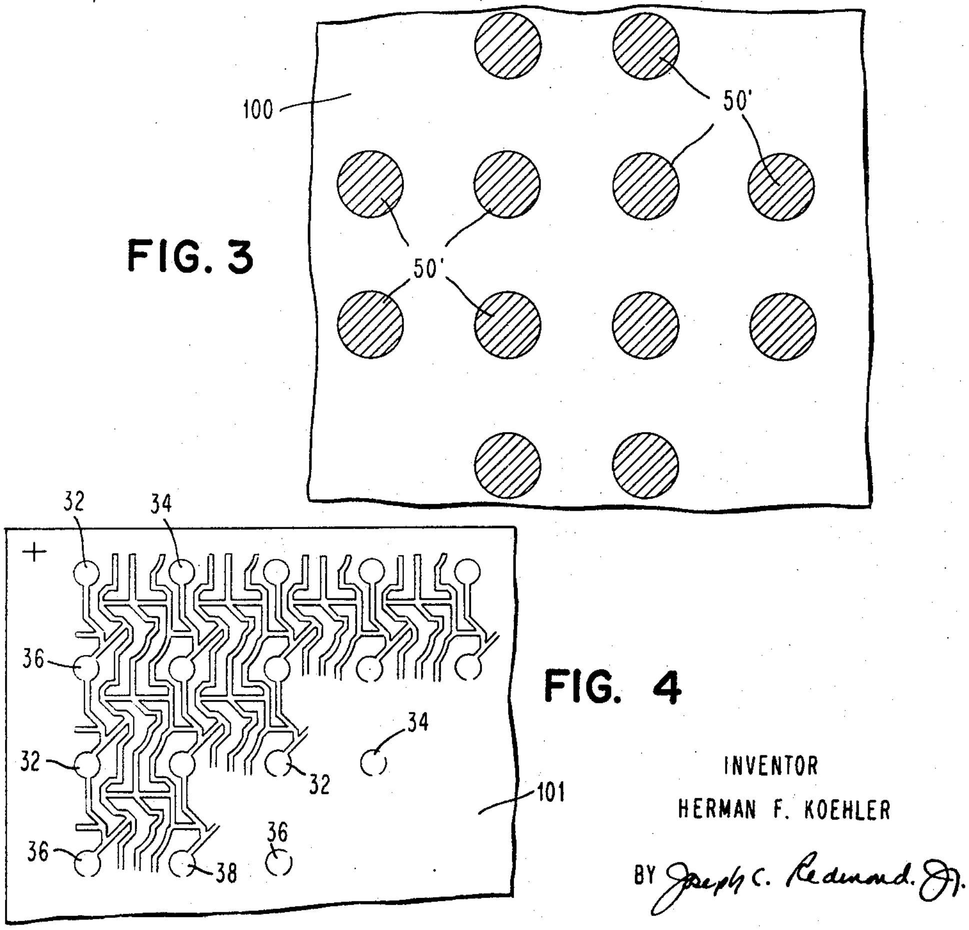
FIGURE 3 is a plan view of a dot pattern that may be employed in conjunction with FIGURE 2 in generating unique topological configurations.
FIGURE 4 is an enlarged view of a plurality of circuit patterns of the type shown in FIGURE 1 arranged in a wiring matrix.

Referring to FIGURES 2 and 3, the topological pattern and break pattern, respectively, are shown as one module in a wiring matrix. The pattern, shown in FIGURE 2, includes circuit points 32, 34, 36 and 38, the configuration being so arranged that any one point is connected with any other point. The horizontal spacing between the points is such that three vertical paths 40, 42 and 44 extend through the modulator pattern for connecting the points to all other points external to the indicated module. Interconnecting the points in a horizontal direction is a path 46 which includes sections *a*, *b*, *c* and *d*, the horizontal line 46 intersecting the vertical paths 40, 42 and 44. The horizontal path 46 also intersects alternate vertical paths 48 which extend between the points 32 and 36 and 34 and 38. It is believed apparent a connection may be made between any two points in the modular pattern by traversing the appropriate horizontal and vertical paths. Such a module, when expanded into a matrix, appears as indicated in FIGURE 4. Elements appearing in FIGURE 4 and corresponding to those appearing in FIGURE 2 have been assigned identical reference character designations.

A break pattern 100 suitable for use with the topological pattern 101, shown in FIGURE 2, is indicated in FIGURE 3. Although dots have been indicated as the basic geometrical figure in the pattern, it is believed evident that other geometrical figures may be substituted. The break pattern is represented by dotted circles 50'. It will be noted that a dotted circle is in all sections of the vertical paths 40, 42 and 44 and the horizontal paths 46*a*, *b*, *c*, and *d*. The dots or circles, as will appear hereinafter, may be employed to break the horizontal and vertical paths at the particular points. By omitting certain dots a connection may be made between any one point and any other point in the matrix. The diameter of the dot has been chosen so that any minor deviation in registering the circuit pattern of FIGURE 2 and the dot pattern of FIGURE 3 will not prevent the dot pattern from covering the width of the pattern.

Having described a generalized wiring matrix, it is now believed to be in order to describe the application of such a matrix in generating unique microminiaturized electric circuits.

Figure 5:
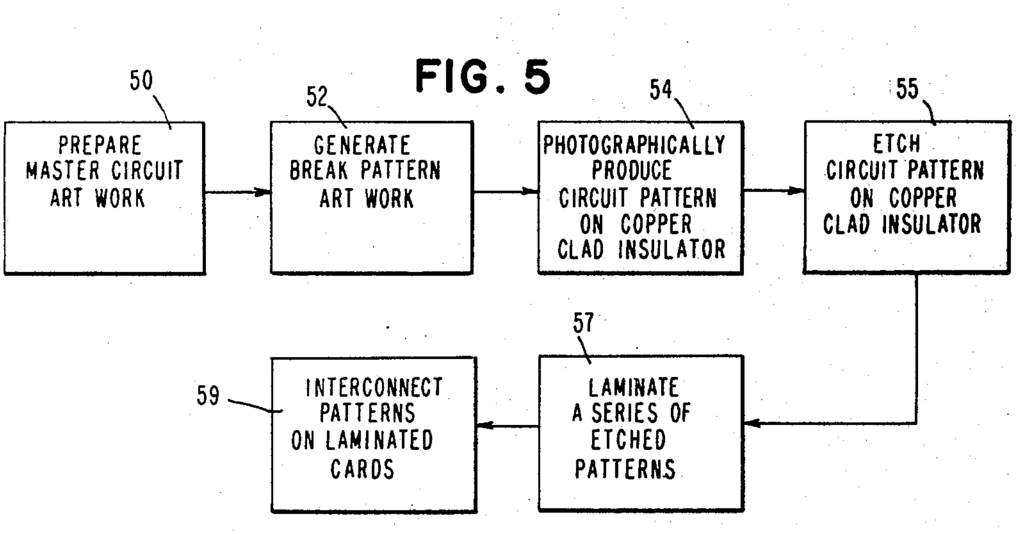
FIGURE 5 is a flow chart of the steps involved in preparing a wiring panel in accordance with the principles of the present invention.

The steps in generating unique electric circuits are indicated in FIGURE 5. The process relates generally to a subtractive printed circuit process. It is believed evident that the invention may be readily altered to be performed in an additive printed circuit process. The subtractive process was arbitrarily selected for reasons of convenience in explanation.

The first step in fabricating circuits in accordance with the present invention is to prepare master artwork of the circuit. The preparation of the master artwork is done by a skilled draftsman. The topological configuration selected, as for example that shown in FIGURE 2, is accurately reproduced on a vellum material which is commercially available. The pattern is drawn to a scale of possibly 60 times that of the final pattern that will be employed in the final wiring matrix. The enlarged scale increases the dimensional stability of the lines in the circuit pattern. The enlargement also provides greater control of line width and spacing. Thus, the final circuit pattern that is drawn is precise with respect to line width, line spacing and circuit point spacing. This feature is of particular importance in generating a modular pattern for the wiring matrix.

After completion of the vellum drawing, the pattern is transferred to a sheet of "studenite" which is a plastic sheet having an acetate base. The "studenite" is employed in a photographic process which reduces the circuit pattern two or three times. Such photographic processes are well-known in the art and described in any conventional printed circuit text. After the reduced photographic circuit pattern has been developed, a step and repeat camera process is employed to generate a matrix array of the modular pattern of the type shown in FIGURE 2. The step and repeat process is described in a previously filed application Ser. No. 161,621, filed Dec. 22, 1961, and assigned to the same assignee as that of the present invention. Briefly, the step and repeat process essentially comprises the steps of displaying the reduced circuit pattern on a suitable material as an image, photographing the image at a particular point on the film of the step and repeat camera. Next, adjusting the camera to take two images in side by side relation. This process continues until one line of images is produced. This single line of the circuit patterns represents one portion of the wiring matrix. The process may be continued by stepping out each line or the single line may be developed and displayed as the second image. The second image may then be photographed the required number of times in the appropriate dimensional relations to complete the wiring matrix. The final photograph is transferred to a glass plate and reduced in size to the final dimensions of the matrix. The final circuit pattern, as displayed on a suitable supporting member, is indicated in FIGURE 4. The horizontal and vertical spacing between the circuit points 32 and 34 and 32 and 36, respectively, is of the order of .125". Line width is of the order of 10 mils. All lines should be limited to 20 mil spacing for electrical reasons. Microminiaturized electronic components may be secured to these circuit points by suitable means such as soldering or male and female contact arrangements. When the components are attached to the matrix, the particular interconnections among the components are completed by the matrix. The present invention describes the process for fabricating matrices to make any desired circuit interconnection.

The next step in the process, as indicated in block 52, is the generation of a dot or break pattern which is combined with the matrix pattern to develop a unique microminiaturized electric circuit. A printed circuit generator (PCG) described in the IBM Technical Disclosure Bulletin, volume 4, No. 7, December 1961, page 11, is a computer controlled apparatus for generating unique electric circuits. Briefly, the PCG comprises essentially a programmable light beam which exposes a card mounted on servo tables for movement in X and Y direction. Digital information from magnetic tape controls the light beam and servo tables to trace out desired patterns on a photoresist covered card or a film master. This generator may be computer controlled to provide a series of dots on a photographic plate. These dots correspond to the circles required to intersect the various horizontal and vertical paths of each individual circuit module. Once the photographic plate has been produced, it may be enlarged or reduced in scale, if required, to correspond to the wiring matrix developed in connection with step 50 of the process. Appropriate registration means may be included in each plate member so that the dots are in correct alignment with the circuit paths.

Figure 6A:
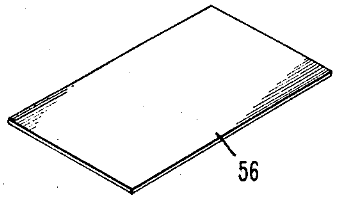
FIGURES 6A, 6B and 6C are schematic representations of a wiring panel being prepared employing the principles of the present invention.

Having generated the necessary artwork for the fabrication of a unique electric circuit, the next step, as indicated in block 54, reproduces the pattern on a copper-clad member. Referring to FIGURE 6A, a copper-clad insulating member 56 is suitably cleaned by employing Markham Compound No. 7 or other suitable cleaning material. Thereafter, the member is covered with a photoresist material, typically Kodak Photo Resist (KPR). Both the cleaning material and the KPR are commercially available. The KPR is dried in a suitable heating environment and thereby placed in condition to receive an image.

Figure 6B:
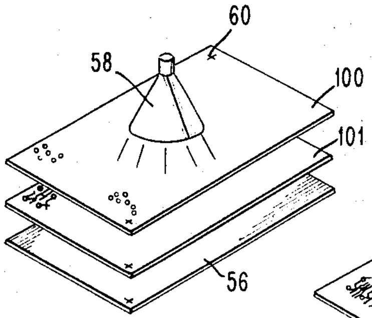
Figure 6C:
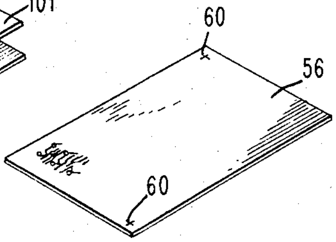

Referring to FIGURE 6B, the circuit pattern and dot pattern artwork together with KPR coated copper-clad member is placed in a direct printer. When the printer is operated, a light 58 is directed through the circuit pattern and dot pattern artwork to the KPR coated copper-clad member 56. The dot pattern is a positive and the circuit pattern is a negative so that the light is transmitted through the patterns in those areas where there is an absence of a dot and the presence of a circuit path. Light passes at only the points necessary to interconnect the desired circuit points. All other points are blocked out by the break pattern so that no light is transmitted to the member 56. The circuit artwork transmits light through all circuit paths except in the areas where a dot overlies the pattern. The final result appearing on the copper-clad member 56 is a hardened KPR reproduction of the desired circuit connection. When the board 56 is washed in water or other substances, the KPR is removed from the surface thereof except in the areas where hardened by the light. Thereafter, the member 56 may be placed in an etching bath, typically ferric-chloride, for a period of time depending upon the thickness of the copper-clad surface of the board 56. The etching bath removes the copper from the surface of the board 56 except in the areas where the hardened KPR has appeared. The member 56 is removed from the etching bath at the end of the etching period and washed to remove any excess acid. The etched board, shown in FIGURE 6C, is hand inspected and treated with additional etching material to remove any defects in the board that were not treated properly during the etching process. Registration guides 60 are placed on the board for alignment purposes in connection with fabricating multilayered card arrangements.

Figure 7:
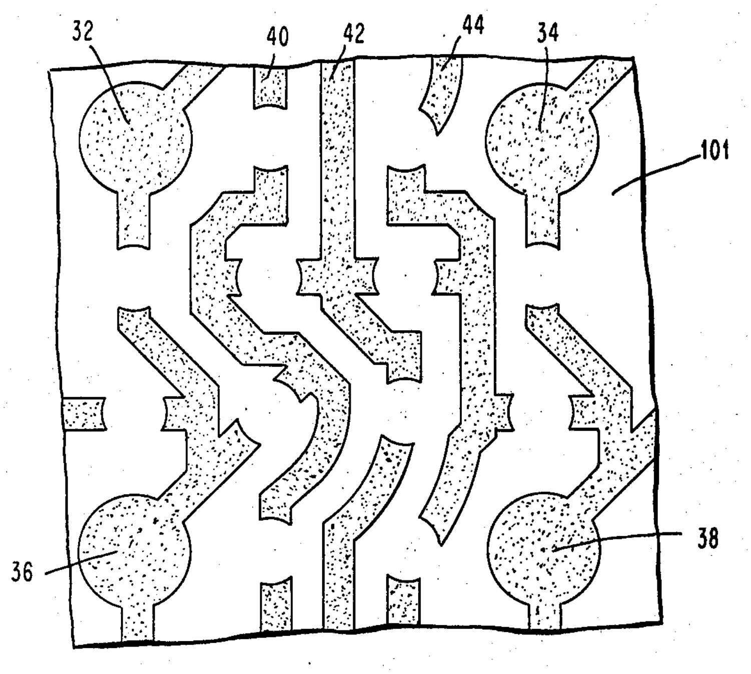
FIGURE 7 is a plan view of the topological pattern of FIGURE 2 with every path broken as generated in accordance with the principles of the present invention.

A portion of the card is shown in FIGURE 7. The circuit pattern, displayed in FIGURE 7, is one of the modules in the final assembly. The connections between circuit points 32, 34, 36 and 38, as well as all remaining possible interconnection combinations have been broken. The circuit interconnections have been broken by the removal of arcuate portions in selected conductor paths. These arcuate portions are, of course, the areas of the circuit paths covered by the dot pattern. Thus, the present invention has provided photographic deletion means for generating unique electric circuits in a wiring matrix. It is believed apparent that the dots may be individually placed in the remaining circuit modules of the wiring matrix by the printed circuit generating means previously described so that any desired circuit configurations may be obtained in the wiring matrix. Since only a single master circuit pattern artwork is required and the printed circuit generator provides individual dot patterns with a high degree of uniformity, the resultant wiring matrices produced in accordance with the principles of the present invention are of virtually identical characteristics. As a result, little or no manual labor is required in the generation of the desired circuits. This feature is of particular importance in fabricating relatively large quantities of circuits required for present day data processing apparatus.

Figure 8:
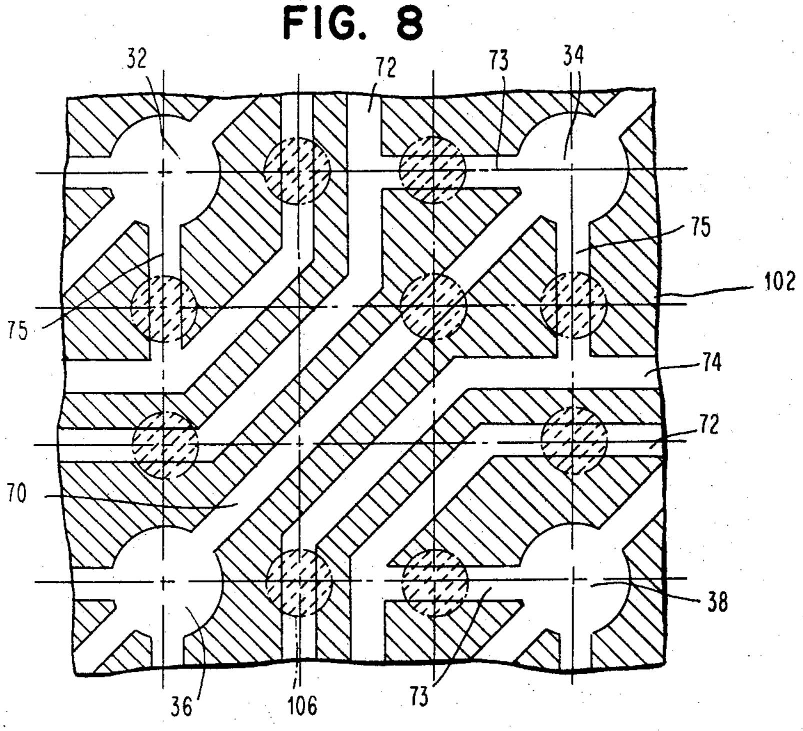
FIGURE 8 is a plan view of another topological configuration that may be employed in the present invention.
Figure 9:
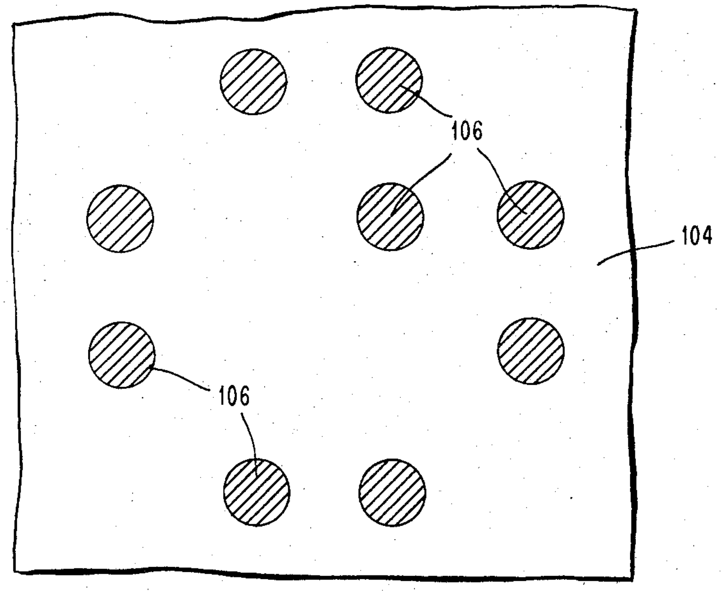
FIGURE 9 is a plan view of a dot pattern that may be employed in conjunction with FIGURE 8 in generating unique topological configurations.

As previously indicated, the topological pattern of FIGURE 2 is not the only configuration that may be employed in the present invention. Referring to FIGURE 8, another configuration 102 is shown for interconnecting circuit points in the matrix. The pattern comprises a series of diagonal conductive paths which interconnect diagonal circuit points. The circuit configuration of FIGURE 8 does not interconnect the dots 32 and 34 or 36 and 38 with each other as in the case of FIGURE 2. Instead, circuit points in an upper right to lower left diagonal relation are interconnected. Thus, the circuit points 34 and 36 are interconnected by diagonal paths 70. Additional paths 72 and 74 are provided between diagonally related points. Connections to circuit points from paths 72 and 74 are provided by 73 and 75, respectively. The circuit point 32 is interconnected with the circuit point 38 of the next vertically aligned module above the module shown. Similarly, circuit point 38 is interconnected with the circuit point 32 of the next vertically aligned module below the module shown. The configuration of FIGURE 8 has a different dot pattern 104, as indicated in FIGURE 9, than that for FIGURE 2. Since fewer points are provided with direct interconnection, the number of dots 106 required for breaking the connections is reduced. The dot configuration is of a different orientation than that shown in FIGURE 3 due to the diagonally oriented conductive paths. Nevertheless, when the break pattern and the topological pattern are produced and utilized in the manner described in connection with FIGURES 1 through 6 a circuit board will be produced corresponding to that shown in FIGURE 7. The resulting circuit pattern interconnects preselected circuit points and has all other circuit points disconnected by the photographic deletion process.

Figure 10:
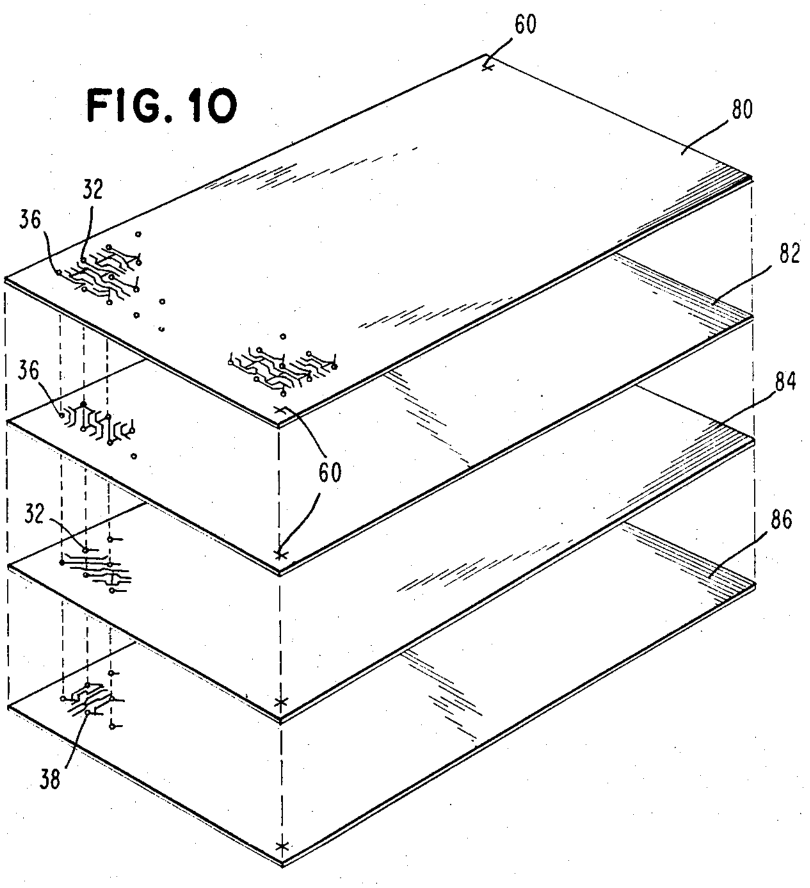
FIGURE 10 is an isometric view of a plurality of wiring panels which may be laminated together and suitably interconnected to interconnect any random points in the panels.

The number of connection possibilities among a plurality of points may be increased by multilayered printed circuit cards. FIGURE 10 shows a first circuit pattern 80 having the matrix configuration of FIGURE 2. The card 80 is superposed above a card 82 having the circuit configuration of FIGURE 8. The card 82 is in turn superimposed above a card 84 having the same circuit configuration of FIGURE 8 and similar to 82; the only distinction being the orientation of the diagonal paths of 84 so that they are at 90° (orthogonal) to those of 82. Finally, card 84 is superimposed on card 86 having the same circuit configuration of FIGURE 2 and similar to 80; the only distiction being the orientation of the three vertical paths of 86 so that they are at 90° (orthogonal) to those of 80. When the series of cards are laminated together, a multilayered card is provided having an increased number of connection possibilities among the modular circuit points. Prior to lamination of the cards, the registration means 60 included in each card are properly disposed so that all circuit points are brought into overlying relation. In this condition, the cards may be suitably laminated in a platen press so that a single card results with an increased number of connection possibilities. The increased number of connection possibilities is realized by connecting the members 80, 82, 84 and 86 at the circuit points by plated-through holes. Thus, any point on the circuit members 80, 82, 84 and 86 may be interconnected by conductive paths over the surface of one board down to another board or boards and across the surface thereof and eventually returning to the first board to the particular point desired to be connected. Such a circuit connection is nonplanar by the fact that the circuit extends over a pluality of wiring planes. It is believed apparent, therefore, that multilayered or nonplanar matrices increase the topological freedom of interconnecting any two points. This feature has considerable significance when it is realized that integrated circuit packages may be plugged into each set of circuit points after suitable terminal arrangements have been completed.

For signal preservation, it is desirable in some instances to include a ground plane in the laminated circuit board to provide shielding effects.

Thus, the complete process of the present invention, as indicated in FIGURE 5, is the lamination of a series of etched cards, indicated in block 57, and interconnecting the cards, as indicated in block 59, to provide a multilayered wiring matrix which has substantially unlimited interconnection possibilities among the modular circuit points. This feature is of particular importance in packaging integrated circuit units which provide integrated circuit techniques. Such units when incorporated within the present packaging proposal provide an increased number of circuit elements with a relatively small volume and with greater flexibility of making interconnection, better changeability and improved reliability.

Although the present invention has described the combination of a positive dot pattern and a negative topological or circuit pattern for producing unique topological configuration in a printed circuit process, the character of the patterns is not necessarily limited to those indicated. That is to say, the present invention in one aspect incorporates the feature of employing a negative dot pattern and a positive topological configuration in a printed circuit process. The printed circuit process may also be additive or subtractive with respect to the final topological configuration. The main feature of the invention, however, is the use of a single master or universal pattern which may be altered by a computer developed pattern to develop any desired unique topological configuration. Nor is the invention necessarily limited to a printed circuit process. The invention also contemplates the production of circuit configurations by silk screening or printing means. For example, a suitable ink could be applied to the copper-clad member through silk screening corresponding to the circuit and dot pattern artwork. After drying the ink by suitable means, the uncoated copper may be etched away as previously described. Thus, a wide variety of alternatives are available for employing the universal topological pattern and a computer generated pattern to develop unique topological configurations.

Nor is the invention limited to a photo deletion process. The invention also contemplates a master artwork having all circuit points disconnected from other circuit points. A second artwork is generated by computer means to complete the connections when the artworks are registered with respect to an insulating member in a printed circuit or like process.

While the invention has been particularly shown or described with reference to preferred embodiments thereof, it will be understood by those skilled in the art that the various changes in form and details may be made therein without departing from the spirit and scope of the invention.

What is claimed is:

1. A process for fabricating unique metallic patterns comprising the steps of:
  - preparing artwork of a universal topological configuration, the artwork including a plurality of points all interconnected by suitable paths and serving as a modular pattern,
  - preparing matrix artwork by a step and repeat photographic process based upon the modular pattern,
  - said matrix artwork including a plurality of points all interconnected by suitable paths,
  - preparing artwork of a desired path modifying pattern which masks out portions of certain selected paths,
  - covering a metal-clad insulating member with a coating of light sensitive emulsion,
  - registering the matrix artwork and the modifying pattern artwork with respect to the metal-clad insulating member,
  - exposing portions of said emulsion to light through said matrix pattern and modifying pattern in order to harden the exposed areas,
  - removing said artworks,
  - washing away the unexposed portions of said emulsion to uncover portions of the metal-clad material, and
  - etching completely away the uncovered metal so that the metallic patterns remain on the insulating member except in those areas not exposed to light to give metallic patterns derived from said master art work and said modifying artwork.

2. A process for fabricating unique metallic patterns comprising the steps of:
  - preparing artwork of a universal modular topological configuration, the artwork including a plurality of points all interconnected by suitable paths;
  - preparing a master matrix plate based upon the modular topological configuration including a plurality of points all interconnected by suitable paths;
  - preparing a path modifying plate having a modifying pattern which masks out certain portions of said paths of said master matrix plate;
  - covering a metallic-clad dielectric base with a coating of light sensitive emulsion;
  - registering and positioning the matrix plate and the path modifying plate over said emulsion-coated base;
  - exposing said emulsion to light through said two registered plates in order to harden the exposed areas; and
  - reproducing the hardened resist emulsion in metal form by washing away unexposed areas and removing uncovered metal areas, the paths among the points in the master matrix plate being reproduced in metallic form except in areas not exposed to light to give metallic patterns derived from a universal interconnected configuration.

3. The method of making a circuit board comprised of:
  - preparing a master plate having a light-transmitting circuit pattern having points connected by paths which can be altered to give different circuits, said master plate having narrow, compactly arranged paths to various closely spaced points;
  - preparing a modifying plate having a light-blocking break pattern of small configurations for masking out certain portions of the paths of said master plate;
  - coating a light sensitive emulsion on a copper-clad circuit board;
  - registering said master plate and said modifying plate so that the break pattern interrupts paths of said master plate and mounting the plates over said circuit board;

transmitting light through said plates so that the light sensitive emulsion hardens and protects the copper for the desired circuit;

removing the plates; and removing the unhardened portions of the light sensitive emulsion and etching unprotected copper so that the points are connected by the uninterrupted paths on the circuit board along those paths not modified by said light-blocking break pattern of the modifying plate and residual broken paths remain in those paths not modified by said light-blocking break pattern of the modifying plate.

4. The method of making a printed circuit board, comprised of:

preparing a master pattern plate having points all connected by paths with said paths having break sections aligned vertically and horizontally;

preparing a path-break modifying plate having break-dots corresponding to selected ones of said break sections so that certain paths remain complete;

registering said plates so that said break-dots overlay said selected break sections of said paths and certain points remain connected by paths to provide a composite pattern;

positioning said registered plates over a prepared printed circuit board having a light sensitive coating on a copper-clad board;

passing light through said registered plates so the exposed areas of the light sensitive coating are hardened; and removing the unhardened portions of the light sensitive emulsion and etching away the exposed copper so that certain points are connected by the uninterrupted paths and the remaining paths are interrupted at the break sections corresponding to said break-dots on the printed circuit board.

5. The method of making a printed circuit laminate structure having a first circuit board and a second circuit board comprised of:

preparing a master matrix pattern plate having a plurality of points all connected by paths with said paths having break sections aligned vertically and horizontally;

preparing a first path-break modifying plate having break-dots corresponding to first-selected one of said break sections among first-selected points;

registering said plates so that said break-dots overlay said selected break sections of said paths and certain points remain connected by paths to provide a composite pattern;

positioning said registered plates over a prepared printed circuit board having a light sensitive coating on a copper-clad board;

passing light through said registered plates so the exposed areas of the light sensitive coating are hardened;

removing the unhardened portions of the light sensitive emulsion and etching away the exposed copper to form a first printed circuit board having a connected point circuit determined by said first modifying plate;

preparing a second path-break modifying plate having break-dots corresponding to second-selected ones of said break sections among second-selected points;

repeating said steps of registering, positioning, passing light, removing and etching utilizing a second path-break modifying plate instead of a first path-break modifying plate to provide a second printed circuit board having a connected point circuit determined by said second modifying plate; and laminating said first and second printed circuit boards so that points overlay and interconnecting the points of the connected point circuits by through-plated holes.

References Cited

UNITED STATES PATENTS

| | | | |
|---|---|---|---|
| 2,972,533 | 2/1961 | Frankau et al. | 96—43 |
| 2,942,973 | 6/1960 | Patrick | 96—35 |
| 2,610,413 | 9/1952 | Dasey | 96—43 |
| 3,065,681 | 11/1962 | Bornemann et al. | 96—27 |
| 3,171,204 | 3/1962 | Balducci | 96—43 |
| 3,169,063 | 2/1965 | Johnston et al. | 96—27 |
| 3,171,741 | 3/1965 | Meyer | 96—35 |
| 2,435,889 | 2/1948 | Kerridge | 96—36 |
| 2,997,392 | 8/1961 | Consaul et al. | 96—36 |
| 3,033,914 | 5/1962 | Acosta-Llearis | 174—68.5 |
| 3,052,749 | 9/1962 | Snapp et al. | 174—68.5 |

OTHER REFERENCES

Eisler: The Technology of Printed Circuits, 1959, Heywood and Co. Ltd., London, pp. 72–75.

NORMAN G. TORCHIN, *Primary Examiner.*

JOHN P. WILDMAN, ALEXANDER D. RICCI, *Examiners.*

D. L. CLAY, C. L. BOWERS, Jr., *Assistant Examiners.*